United States Patent
Nishimura et al.

(10) Patent No.: US 11,532,998 B2
(45) Date of Patent: Dec. 20, 2022

(54) POWER SUPPLY CIRCUIT FOR MEASURING TRANSIENT THERMAL RESISTANCES OF SEMICONDUCTOR DEVICE

(71) Applicant: Sansha Electric Manufacturing Co., Ltd., Osaka (JP)

(72) Inventors: Naoki Nishimura, Osaka (JP); Masashi Fukai, Osaka (JP)

(73) Assignee: Sansha Electric Manufacturing Co., Ltd., Osaka (JP)

( * ) Notice: Subject to any disclaimer, the term of this patent is extended or adjusted under 35 U.S.C. 154(b) by 286 days.

(21) Appl. No.: 16/739,289

(22) Filed: Jan. 10, 2020

(65) Prior Publication Data
US 2020/0259424 A1    Aug. 13, 2020

(30) Foreign Application Priority Data

Feb. 12, 2019   (JP) ............................... JP2019-22601

(51) Int. Cl.
| | |
|---|---|
| H02M 7/5395 | (2006.01) |
| G01R 31/26 | (2020.01) |
| H01L 23/58 | (2006.01) |
| H02M 1/32 | (2007.01) |
| H02M 7/5387 | (2007.01) |

(52) U.S. Cl.
CPC .......... *H02M 7/5395* (2013.01); *G01R 31/26* (2013.01); *G01R 31/2619* (2013.01); *H01L 23/58* (2013.01); *H02M 1/32* (2013.01); *H02M 7/53871* (2013.01); *H02M 1/327* (2021.05)

(58) Field of Classification Search
CPC .. H02M 7/5395; H02M 1/32; H02M 7/53871; H02M 1/327; H02M 3/33507; G01R 31/26; G01R 31/2619; G01R 31/2628; H01L 23/58
See application file for complete search history.

(56) References Cited

U.S. PATENT DOCUMENTS

| | | | |
|---|---|---|---|
| 9,948,285 B2* | 4/2018 | Koyasu | ............... H01H 47/325 |
| 10,065,261 B2* | 9/2018 | Morimoto | ............ B23K 9/1062 |
| 10,086,463 B2* | 10/2018 | Ikejiri | .................... B23K 9/073 |

(Continued)

FOREIGN PATENT DOCUMENTS

| | | | | |
|---|---|---|---|---|
| JP | 2001275393 | A | * | 10/2001 |
| JP | 2002228704 | A | * | 8/2002 |

(Continued)

*Primary Examiner* — Feba Pothen
(74) *Attorney, Agent, or Firm* — Renner, Otto, Boisselle & Sklar, LLP

(57) ABSTRACT

A power supply circuit for measuring transient thermal resistances includes an inverter circuit provided on a primary side of a transformer and controlled by a PWM signal, a rectifier circuit provided on a secondary side of the transformer and including a DC reactor, and a control circuit controlling the PWM signal so as to output a pulsed output current from the rectifier circuit to a semiconductor device to be measured. The control circuit sets a first PWM frequency at rising timing of the output current, and sets a second PWM frequency when a predetermined time t1 elapses from the rising timing of the output current. The control circuit sets the first PWM frequency higher than the second PWM frequency.

4 Claims, 6 Drawing Sheets

(56) References Cited

U.S. PATENT DOCUMENTS

| | | | | |
|---|---|---|---|---|
| 2009/0179652 A1* | 7/2009 | Obara | ............... | G01R 31/2851 |
| | | | | 324/537 |
| 2010/0007327 A1* | 1/2010 | Andoh | ............. | G01R 31/31924 |
| | | | | 324/76.11 |
| 2010/0045195 A1 | 2/2010 | Yamamuro et al. | | |
| 2016/0241144 A1 | 8/2016 | Onodera et al. | | |
| 2016/0301303 A1 | 10/2016 | Bari et al. | | |
| 2019/0074821 A1* | 3/2019 | Higashi | ................. | H03K 17/64 |
| 2019/0381597 A1* | 12/2019 | Miyajima | ............... | H02M 7/06 |

FOREIGN PATENT DOCUMENTS

| | | |
|---|---|---|
| JP | 2010-049523 A | 3/2010 |
| JP | 2013-84666 A | 5/2013 |
| JP | 2016-149867 A | 8/2016 |

* cited by examiner

Fig. 5

FORMULA OF TEMPERATURE RISE OF SEMICONDUCTOR $$\Delta t = \{\theta th(j-c) \times (Pon + Psw)\} + \{\theta th(f-a) + \theta th(c-f)\} \times (Pon + Psw) \times N$$

$\Delta t$ ··· DIFFERENCE BETWEEN AMBIENT TEMPERATURE AND TEMPERATURE OF JUNCTION OF SEMICONDUCTOR DEVICE
$\theta th(j-c)$ ··· TRANSIENT THERMAL RESISTANCE VALUE BETWEEN JUNCTION AND CASE OF SEMICONDUCTOR DEVICE
$\theta th(c-f)$ ··· TRANSIENT THERMAL RESISTANCE VALUE OF MATERIAL BETWEEN CASE OF SEMICONDUCTOR DEVICE AND HEAT SINK
$\theta th(f-a)$ ··· TRANSIENT THERMAL RESISTANCE VALUE BETWEEN HEAT SINK AND AMBIENT TEMPERATURE
Pon ··· CONDUCTION LOSS OF SEMICONDUCTOR
Psw ··· SWITCHING LOSS OF SEMICONDUCTOR
N ··· NUMBER OF SEMICONDUCTORS TO BE USED

POWER SUPPLY CIRCUIT FOR MEASURING TRANSIENT THERMAL RESISTANCES OF SEMICONDUCTOR DEVICE

BACKGROUND OF THE INVENTION

1. Field of the Invention

The present invention relates to a power supply circuit for measuring transient thermal resistances including an inverter circuit. In this power supply circuit for measuring transient thermal resistances, a pulsed output current is applied to a semiconductor device to be measured from a rectifier circuit connected to the secondary side of a transformer. The transient thermal resistances of the semiconductor device are measured while the output current is applied to the semiconductor device.

2. Description of the Related Art

In the design of a semiconductor circuit, it may be necessary to predict a temperature rise when instantaneous power is applied to a semiconductor device. In order to predict the temperature rise, transient thermal resistances, which is are one of the characteristics of the semiconductor device are used. The transient thermal resistances are a necessary characteristic particularly in a power semiconductor device to which a large amount of power is applied.

The transient thermal resistances are represented by plotting a graph in which the abscissa represents the conduction time of the pulsed output current and the ordinate represents the transient thermal resistance. It is considered that this graph can be measured by preparing a power supply device that can obtain an output current having a predetermined pulse width. In this power supply apparatus, it is necessary to control the pulse width for a short time to a long time of, for example, several ms to 1000 s. Therefore, the power supply device includes an inverter circuit for switching the switching element by a PWM signal.

However, if the semiconductor device to be measured is a power semiconductor device that flows several tens of A to 100 A or more, the junction temperature of the power semiconductor device rapidly increases. Therefore, if the rising of the output current is gentle, the measurement accuracy of the transient thermal resistances at the time of the rising, in particular, in the vicinity of several ms to several tens of ms is decreased. In order to solve this problem, the frequency of the PWM signal may be set high to steepen the rise of the output current. However, if the frequency of the PWM signal is set high, the loss of the switching device of the inverter circuit becomes large enough not to be ignored when a large current flows through the semiconductor device for a long time of several 100 seconds to 1000 seconds or more. This causes a thermal problem of the entire power supply circuit.

Due to such a problem, it is very difficult to measure the transient thermal resistances by applying a pulsed output current to the semiconductor device to be measured. Therefore, conventionally, an equivalent circuit at the time of transient immediately after the current of the semiconductor device is turned on has been formed, and the transient thermal resistances have been estimated by a predetermined calculation formula on the basis of the equivalent circuit (see Japanese Patent Application Laid-Open No. 2013-084666).

However, in the above-mentioned prior publication, the transient thermal resistances have been estimated using a calculation formula. This has caused a problem of poor accuracy.

SUMMARY OF THE INVENTION

In view of the foregoing, a main object of the present invention is to provide a power supply circuit for measuring transient thermal resistances of a semiconductor device capable of obtaining the transient thermal resistances with high accuracy. Another object of the present invention is to provide a power supply circuit for measuring transient thermal resistances of a semiconductor device in which a heat loss of an inverter circuit is not increased even when a pulse width of a pulsed output current is large.

The power supply circuit for measuring transient thermal resistances of the present invention includes an inverter circuit provided on a primary side of a transformer and controlled by a PWM signal, a rectifier circuit provided on a secondary side of the transformer and including a DC reactor, and a control circuit controlling the PWM signal so as to output a pulsed output current from the rectifier circuit to a semiconductor device to be measured.

The control circuit sets a frequency of the PWM signal to the first PWM frequency at rising timing of the output current, and sets the frequency of the PWM signal to the second PWM frequency when a predetermined time t1 elapses from the rising timing of the output current. Then, the first PWM frequency is set higher than the second PWM frequency. This makes it possible to measure the transient thermal resistances of the semiconductor device to be measured.

The first PWM frequency is set to about 2 to 5 times the second PWM frequency. For example, the second PWM frequency is set to 25 kHz, and the first PWM frequency is set to 100 kHz. The predetermined time t1 is a time of several ms, which is from the rising of the output current until the output current reaches a predetermined value after the transient period of the rising of the output current elapses.

When the output current reaches a certain value, the PWM frequency is switched from the first PWM frequency to the second PWM frequency that is lower than the first PWM frequency.

Such control makes it possible to obtain the transient thermal resistances of the semiconductor device with high accuracy because the rise of the pulsed output current output to the semiconductor device to be measured is accelerated. Further, since the PWM frequency decreases when the predetermined time t1 elapses from the rise of the output current, the heat loss of the inverter circuit portion does not increase.

BRIEF DESCRIPTION OF THE DRAWINGS

FIG. 5 shows an equation for obtaining the simulation result.

DETAILED DESCRIPTION OF THE EMBODIMENTS

Figure 1:
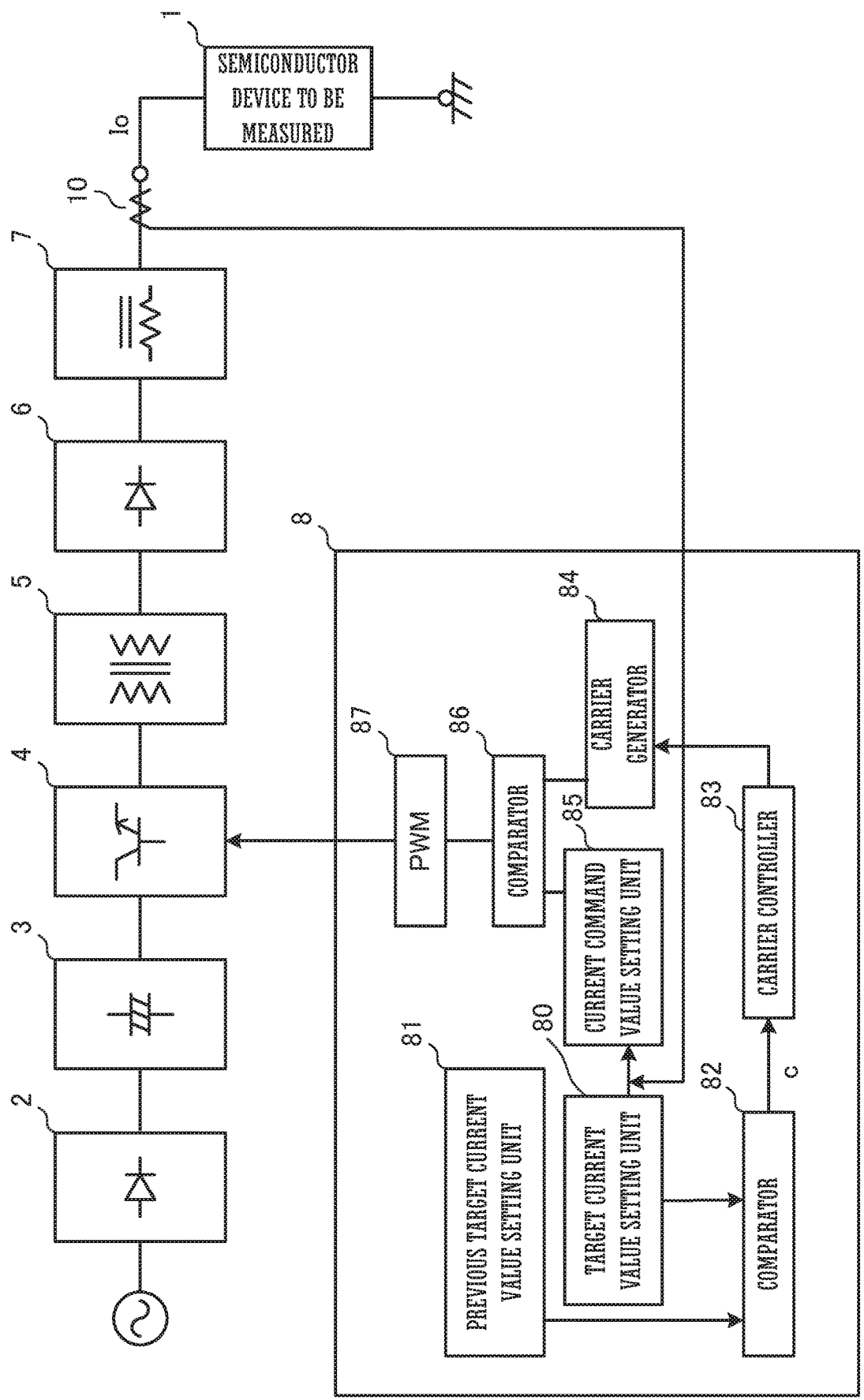
FIG. 1 shows a circuit block diagram of an inverter-controlled DC power supply according to an embodiment of the present invention.
Figure 2:
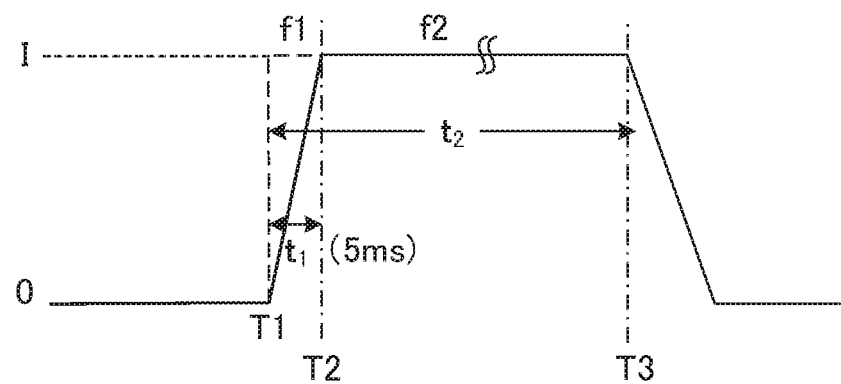
FIG. 2 shows a waveform diagram of an output current of the DC power supply.

FIG. 1 shows a circuit block diagram of an inverter-controlled DC power supply according to an embodiment of the present invention. FIG. 2 is a waveform diagram of an output current Io.

A semiconductor device 1 to be measured is connected to the inverter-controlled DC power supply as a load.

The AC current from a commercial power supply is changed to a direct current by a rectifier 2. The output of the rectifier 2 is smoothed by a smoothing circuit 3. The output of the smoothing circuit 3 is inputted to an inverter circuit 4. The output of the inverter circuit 4 is transformed by a transformer 5. The output of the transformer 5 is rectified by a rectifier 6. The output of the rectifier 6 is smoothed by a smoothing circuit 7 including a DC reactor. The output current (pulsed output current) of the smoothing circuit 7 is supplied to the semiconductor device 1. The inverter circuit 4 is configured by, for example, bridging a plurality of semiconductor switching elements. The output current Io is detected by a current sensor 10 and fed back to a control circuit 8. A pulsed output current Io as shown in FIG. 2 is outputted to the semiconductor device 1. In the semiconductor device 1, the transient thermal resistances are measured when the output current Io is supplied as an on-state current. More specifically, the pulsed output current Io is applied to the semiconductor device 1 in the ON state, and a change in the junction voltage between the collector and the emitter or the like is measured for each energization time. From the measurement result, the transient thermal resistances are obtained by referring to a predetermined equation. At this time, as the output current Io rises faster, the required accuracy of the transient thermal resistances is improved. The transient thermal resistances can be obtained from FIG. 2 by the following equation.

$$\theta th = \{t(Tx) - t(T1)\}[°\text{ C.}]/P[w] = \{t(Tx) - t(T1)\}/\{I \times V\text{on}\}$$

P: Loss of the semiconductor device 1

I: Current flowing through the semiconductor device 1

Von: On-voltage of the semiconductor device 1 at an energization current

Tx: Elapsed time (energization time)

By employing a configuration in which the output current Io is controlled to a constant current by the control circuit 8, it becomes unnecessary to connect a load resistor to the semiconductor device 1.

The control circuit 8 generates a PWM signal for switching the semiconductor switching elements of the inverter 4. Then, the frequency (PWM frequency) of the PWM signal is controlled so that the output current Io from the smoothing circuit 7 becomes a target current value.

As shown in FIG. 1, the control circuit 8 sets the target current value, and sets the PWM frequency so that the output current Io becomes the target current value. The control circuit 8 is configured as follows.

A target current value setting unit 80 sets a target current value of the output current Io to be controlled at the present control timing. The target current value is called the present target current value hereinafter. A previous target current value setting unit 81 sets the target current value of the output current Io that had been controlled at the previous control timing. The previous target current value is called the previous target current value hereinafter. A comparator 82 outputs the difference between the present target current value and the previous target current value as an output c. At the timing at which the output current Io rises, the present target current value becomes I, and the previous target current value becomes I (−1) (=zero). At this time, the output c rises. A carrier controller 83 sets a carrier frequency based on the value of the output c. A carrier generator 84 generates a carrier having the carrier frequency set by the carrier controller 83. The carrier is a high-frequency signal of a sawtooth wave. A current command value setting unit 85 obtains an error between the present target current value and the output current Io detected by the current sensor 10 this time, and sets the current command value so that the error becomes zero. A comparator 86 compares the current command value with the carrier generated by the carrier generator 84 to determine a period in which the PWM signal is ON. A PWM signal generator 87 outputs a PWM signal based on the output of the comparator 86. The PWM frequency at this time coincides with the carrier frequency.

Next, the operation of the control circuit 8 will be described.

Until the control timing reaches the time T1 at which the output current Io rises, the present target current value set in the target current value setting unit 80 and the previous target current value set in the previous target current value setting unit 81 are both zero. Since the output c of the comparator 82 is zero, the carrier frequency is zero in the carrier controller 83. Thus, the PWM signal is not generated from the PWM signal generator 87.

When the control timing becomes T1, the target current value setting unit 80 sets the present target current value to I. Since the previous target current value I (−1) is zero, the output c rises. In the carrier controller 83, the carrier frequency is set to the first frequency f1. The first frequency f1 is here 100 kHz. Carriers of the first frequency f1 are generated in the carrier generator 84. A PWM signal of the first frequency f1 is generated from the PWM signal generator 87 and supplied to the inverter circuit 4. At T1, the first frequency f1 is a high frequency of 100 kHz. Therefore, the rise of the output current Io becomes faster.

When the control timing becomes T2 after 5 ms, which is the predetermined time t1, has elapsed from T1, the carrier controller 83 sets the carrier frequency to the second frequency f2 which is lower. The time of 5 ms is set as the time from the rise time T1 of the output current Io to the target current value I by the control of the first frequency f1. This 5 ms is experimentally obtained in advance. The time t1 becomes longer as the output current Io becomes larger, but is usually in the range of about several ms to 10 ms. The second frequency f2 is the lower frequency, 25 kHz. Then, the PWM signal generated by the PWM signal generator 87 also becomes f2. The frequency of the PWM signal supplied to the inverter circuit 4 is the second frequency f2 of 25 kHz. After T2, the second frequency f2 is a low frequency of 25 kHz. Therefore, even if t2 is a long period of about several 100 seconds to 1000 seconds, the switching loss of the inverter circuit 4 does not become excessively large.

The above-mentioned output current Io is applied to the semiconductor device 1 in a state in which the semiconductor device 1 is ON. Then, a change in the junction voltage or the like for each energization time of the semiconductor device 1 is measured. Thereafter, the transient thermal resistances of the semiconductor device 1 are determined from these measured values.

The times T1 and T2 are set in advance and stored in the target current value setting unit 80 and the carrier controller 83.

By such control, the output current Io outputted to the semiconductor device 1 rises quickly. Further, the switching loss after T2 of the inverter circuit 4 is not increased. Therefore, the accuracy of the transient thermal resistances can be improved, and the heat loss of the inverter circuit 4 can be reduced.

Figure 3A:
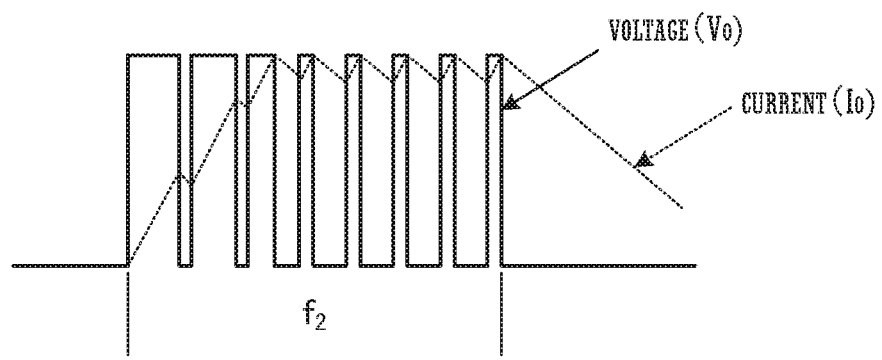
FIG. 3A shows a waveform diagram of an output current Io and an output voltage Vo when a PWM frequency is set to a second frequency f2 in the entire pulse signals.
Figure 3B:
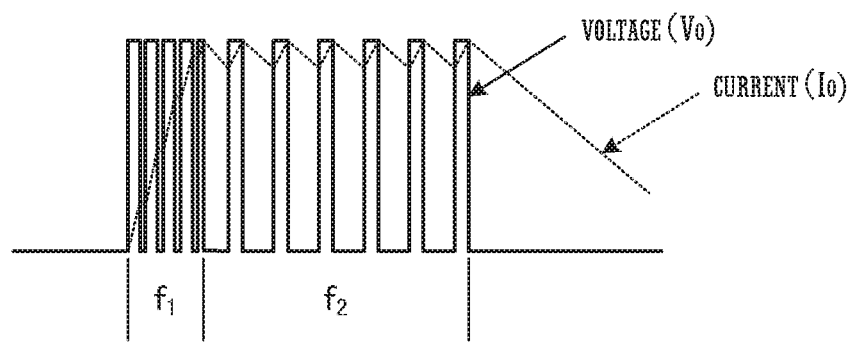
FIG. 3B is a waveform diagram of the output current Io and the output voltage Vo when the frequency of the rising time is set to a first frequency f1 and then the frequency is set to the second frequency f2.

FIG. 3A shows a waveform diagram of an output current Io and an output voltage Vo when a PWM frequency is set to a second frequency f2 in the entire pulse signals. FIG. 3B is a waveform diagram of the output current Io and the output voltage Vo when the frequency of the rising time T1 is set to a first frequency f1 and then the frequency is set to the second frequency f2 at T2. In FIG. 3A, the rise of the output current Io is gentle. In FIG. 3B, the output current Io rises steeply.

Figure 4:
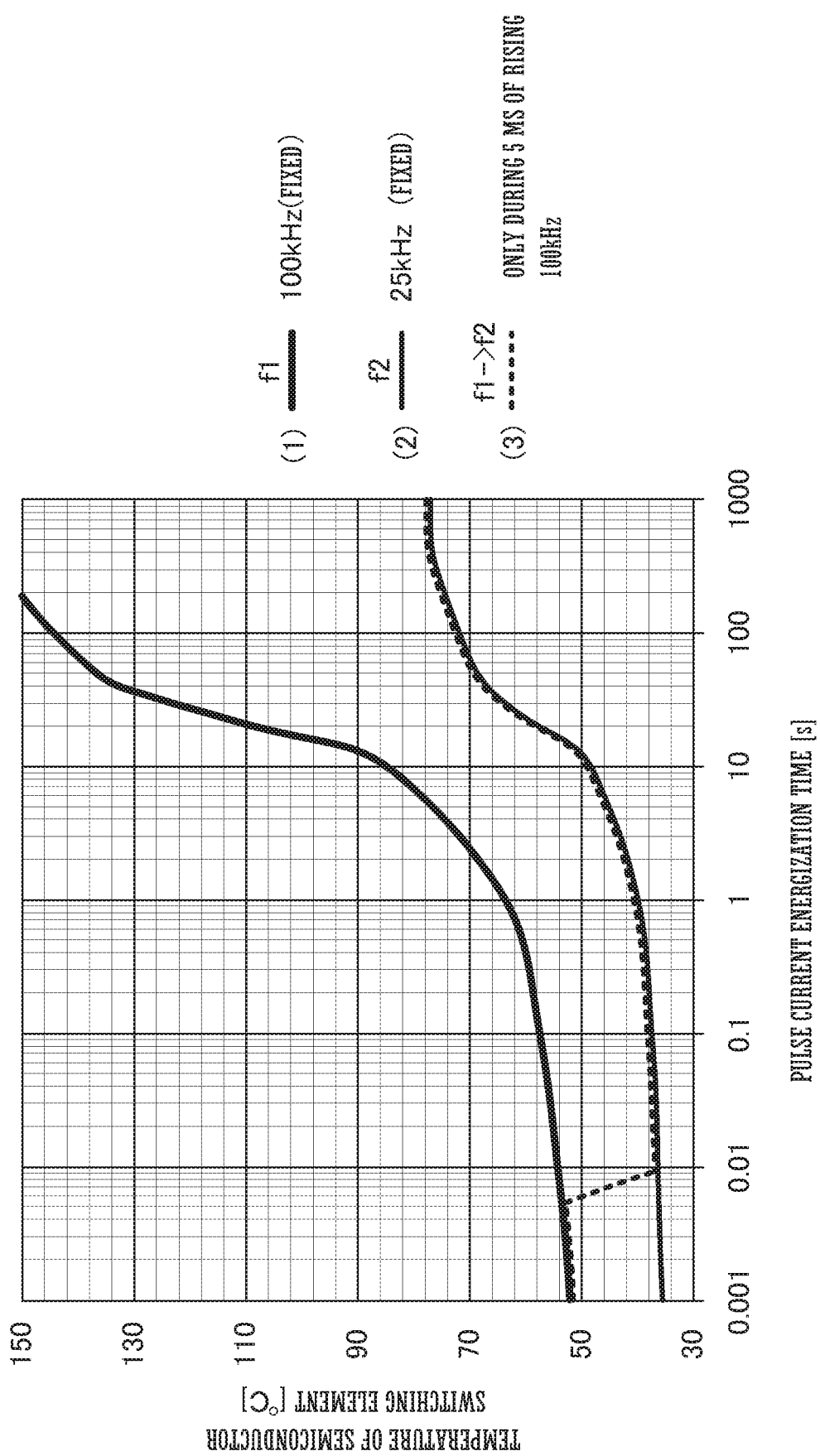
FIG. 4 shows a simulation result showing a change in the junction temperature of the switching elements of an inverter circuit 4.

FIG. 4 shows a simulation result showing a change in the junction temperature of the switching elements of the inverter circuit 4. FIG. 5 shows an equation for obtaining the simulation result. In FIG. 4, the ambient temperature is 25 degrees, and the number of switching elements to be used in the inverter circuit 4 is 8, which is obtained by the above equation of FIG. 5.

In FIG. 4, the changes of the following three cases 1) to 3) are indicated.

1) The whole pulse-output current width (1000 s) is fixed at the first PWM frequency of 100 kHz.

2) The whole pulse-output current width (1000 s) is fixed at the second PWM frequency of 25 kHz.

3) The first PWM frequency is set to 100 kHz at T1, and the second PWM frequency is set to 25 kHz at T2 when 5 ms has elapsed from T1.

In the above case 3), the change in the junction temperature shows the same change as in the above case 1) from the time T1 to the time T2 during the rising of the output current Io. The junction temperature decreases after 5 ms elapses. The subsequent junction temperature changes in the same manner as in the above case 2).

Therefore, the rise of the output current Io can be accelerated by performing the control of the above case 3). In addition, the amount of heat generated by the entire inverter circuit can be significantly reduced in the same manner as in the above case 2).

Figure 6:
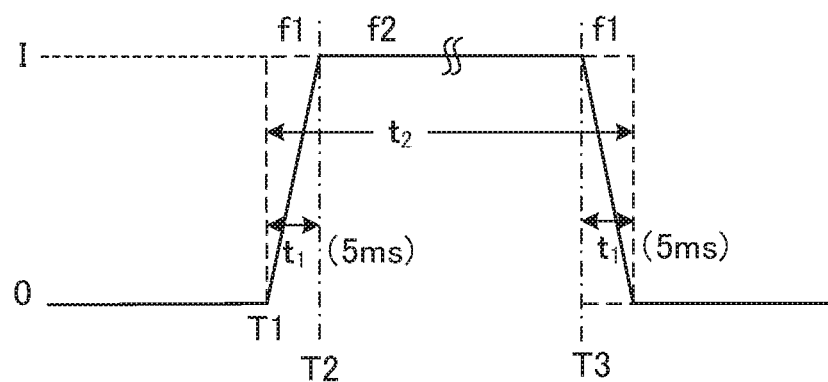
FIG. 6 shows a waveform diagram of an output current in another embodiment of the present invention.

FIG. 6 shows a waveform diagram of an output current in another embodiment of the present invention.

In this embodiment, the PWM frequency is changed from f2 to f1 at the falling time T3 of the output current Io. This accelerates the fall of the output current Io. More specifically, the PWM frequency is changed from f2 to f1 at T3 when the (t2-t1) elapses from T2. At T3, the target current value set in the target current value setting unit 80 becomes zero from I. Since the previous target current value of the previous target current value setting unit 81 is I, the output c of the comparator 82 falls. When the (t2-t1) elapses from T2 and then the timing becomes T3, the carrier controller 83 changes the PWM frequency from f2 to f1. Then, the PWM frequency becomes f1 from f2, and the output current Io steeply falls to zero.

As described above, by increasing the PWM frequency even at the timing T3 when the output current Io falls, it is possible to improve the accuracy of the transient thermal resistance measurement at the end of the energization time of the semiconductor device 1.

Finally, the foregoing preferred embodiments are illustrative in all points and should not be construed to limit the present invention. The scope of the present invention is defined not by the foregoing preferred embodiment but by the following claims. Further, the scope of the present invention is intended to include all modifications within the scopes of the claims and within the meanings and scopes of equivalents.

What is claimed is:

1. A power supply circuit for measuring transient thermal resistances of a semiconductor device, comprising:
    a transformer;
    an inverter circuit provided on a primary side of the transformer and controlled by a PWM signal;
    a rectifier circuit provided on a secondary side of the transformer and including a DC reactor; and
    a control circuit controlling the PWM signal so as to output a pulsed output current from the rectifier circuit to the semiconductor device to be measured,
    wherein the pulsed output current output to the semiconductor device to be measured includes an individual current pulse defined by a rising edge and a falling edge, and
    the control circuit sets a frequency of the PWM signal to a first PWM frequency at a timing of the rising edge of the individual current pulse, sets a frequency of the PWM signal to a second PWM frequency at timing when a predetermined time t1 elapses from the timing of the rising edge of the individual current pulse, the predetermined time t1 being less than a time between the rising edge and the falling edge of the individual current pulse, and sets the first PWM frequency to be higher than the second PWM frequency, thereby measuring the transient thermal resistances of the semiconductor device.

2. The power supply circuit for measuring transient thermal resistances of the semiconductor device according to claim 1, wherein the control circuit sets a frequency of the PWM signal to the first PWM frequency at the timing of the falling edge of the individual current pulse, and sets the first PWM frequency to be higher than the second PWM frequency.

3. A method of measuring transient thermal resistances of the semiconductor device, comprising:
    outputting a pulsed output current from an inverter circuit controlled by a PWM signal to the semiconductor device to be measured, the pulsed output current output to the semiconductor device to be measured including an individual current pulse defined by a rising edge and a falling edge;
    setting a frequency of the PWM signal to a first PWM frequency at a timing of the rising edge of the individual current pulse; and
    setting a frequency of the PWM signal to a second PWM frequency at timing when a predetermined time t1 elapses from the timing of the rising edge of the individual current pulse, the predetermined time t1 being less than a time between the rising edge and the falling edge of the individual current pulse, wherein the first PWM frequency is higher than the second PWM frequency.

4. The method of measuring transient thermal resistances of a semiconductor device according to claim 3, further comprising setting a frequency of the PWM signal to the first PWM frequency at the timing of the falling edge of the individual current pulse, wherein the first PWM frequency is higher than the second PWM frequency.

* * * * *